(12) United States Patent
Kermarec et al.

(10) Patent No.: US 7,547,914 B2
(45) Date of Patent: Jun. 16, 2009

(54) SINGLE-CRYSTAL LAYER ON A DIELECTRIC LAYER

(75) Inventors: Olivier Kermarec, Gieres (FR); Yves Campidelli, Grenoble (FR); Guillaume Pin, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 44 days.

(21) Appl. No.: 11/653,760

(22) Filed: Jan. 16, 2007

(65) Prior Publication Data

US 2007/0278494 A1    Dec. 6, 2007

(30) Foreign Application Priority Data

Jan. 17, 2006    (FR) .................................. 06 00414

(51) Int. Cl.
*H01L 31/036* (2006.01)
(52) U.S. Cl. .............. 257/51; 257/64; 257/75; 257/E21.379; 438/166
(58) Field of Classification Search ........... 257/51, 257/E21.379
See application file for complete search history.

(56) References Cited

U.S. PATENT DOCUMENTS

| | | | |
|---|---|---|---|
| 5,976,959 A | * | 11/1999 | Huang .................. 438/487 |
| 6,537,370 B1 | | 3/2003 | Hernandez et al. |
| 2004/0157412 A1 | | 8/2004 | Seifert |
| 2005/0054180 A1 | | 3/2005 | Han et al. |
| 2005/0136566 A1 | | 6/2005 | Morse |

OTHER PUBLICATIONS

Min-Lin Cheng et al., "Selective Ge CVD as a Via Hole Filling Method and Self-Aligned Impurity Diffusion Microsource in Si Processing," Japanese Journal of Applied Physics, Tokyo, Japan, vol. 28, No. 11, Part 2, Nov. 1, 1989, pp. L2054-L2056.

* cited by examiner

*Primary Examiner*—Tu-Tu V Ho

(57) ABSTRACT

The process relates to the production of a layer of a single-crystal first material on a second material. The second material has at least one aperture exposing a surface portion of a single-crystal third material. The process generally includes forming an at least partially crystalline first layer of said first material on said surface portion of the third material. Then, an amorphous or partially crystalline second layer of the first material is formed on the at least partially crystalline first layer of the first material and on one part of the second material that is around said aperture. Finally, the process includes recrystallization annealing of the first material. Thus, it is possible to produce, within one and the same wafer, either transistors on a germanium-on-insulator substrate with transistors on a silicon-on-insulator substrate, or transistors on a germanium-on-insulator substrate with transistors on a silicon substrate.

17 Claims, 2 Drawing Sheets

SINGLE-CRYSTAL LAYER ON A DIELECTRIC LAYER

CROSS-REFERENCE TO RELATED APPLICATIONS

The present application is related to French Patent Application No. 0600414, filed Jan. 17, 2006, entitled "PROCESS FOR THE PRODUCTION OF A SINGLE-CRYSTAL LAYER ON A DIELECTRIC LAYER". French Patent Application No. 0600414 is assigned to the assignee of the present application and is hereby incorporated by reference into the present disclosure as if fully set forth herein. The present application hereby claims priority under 35 U.S.C. §119(a) to French Patent Application No. 0600414.

TECHNICAL FIELD

The present disclosure relates to a method of producing a single-crystal semiconductor layer on a dielectric layer, and more particularly to the localized production of a single-crystal semiconductor layer on a dielectric layer.

BACKGROUND

Semiconductor wafers are the substrates for current integrated circuits. The conventional production and performance of integrated circuits fabricated on a wafer are dependent on the choice, quality and dimensions of the semiconductor material of the wafer. Originally made of pure silicon, wafer compositions have evolved owing to the advent of new technologies. Thus, one example of how semiconductor wafers have evolved is the production of single-crystal SOI (Silicon On Insulator) wafers. In these wafers, the silicon layer useful for integration of devices is much thinner than hitherto, being of the order of a few tens of nanometers. A subjacent dielectric layer, interposed between the useful silicon layer and the silicon substrate, makes it possible not only to give the assembly rigidity but also to act as an electrical insulator. Thus, the performance of transistors produced in this type of wafer can be enhanced.

In some conventional semiconductor wafers, silicon is replaced with a semiconductor material having a lower electrical resistivity. An example of such a material is germanium. Thus, a silicon-germanium alloy on insulator wafers and a strained silicon-germanium alloy on insulator wafers have been proposed. The latter have an even lower resistivity due to the stresses exerted on the semiconductor layer. Germanium on insulator wafers have also been able to be produced, especially thanks to a process already used to produce silicon on insulator wafers and described in the document "Réalisation en première mondiale du substrats Germanium sur Isolant (GeOI) [First production in the world of germanium-on-insulator (GeOI) substrates"] accessible on the Commissariat à l'Energie Atomique Internet site www.cea.fr. The principle of this process is to produce using implanted ions, a weakened zone within the depth of a bulk material and then to cause a fracture along the weakened plane in order to create a thin wafer. However, this process makes it possible to produce only entire germanium-on-insulator wafers.

Germanium is, however, a costly material and is less abundant than silicon. Moreover, the most effective technology may be that of silicon or that of germanium depending on the type of device (n-channel or p-channel transistor) or the type of function (electronic or optoelectronic). Thus, to combine the advantages of the two technologies, it may be advantageous to integrate the silicon and germanium technologies on the same integrated circuit. This is generally referred to as "co-integration". Co-integration may thus require germanium-on-insulator zones to be locally integrated on a silicon substrate. The process described above therefore cannot be adapted to cases in which silicon and germanium technologies must be used together in integrated circuits.

Therefore, there is a need for a process for the production of a layer of a single-crystal first material on a second material, said second material having at least one aperture exposing a surface portion of a single-crystal third material.

SUMMARY

The present disclosure provides a process for the production of a layer of a single-crystal first material on a second material, said second material having at least one aperture exposing a surface portion of a single-crystal third material.

In one embodiment, the present disclosure provides a process for producing a single-crystal first material layer on a second material. The second material has at least one aperture exposing a surface portion of a single-crystal third material. The process includes forming an at least partial crystalline first layer of the first material on the surface portion of the third material. The process also includes forming a partially crystalline second layer of the first material on the at least partially crystalline first layer of the first material and on one part of the second material that is around the aperture. The process further includes recrystallization annealing of the first material.

In another embodiment, the present disclosure provides a method of producing a single-crystal first material layer on a second material. The second material has at least one aperture exposing a surface portion of a single-crystal third material. The method includes forming an at least partial crystalline first layer of the first material on the surface portion of the third material by performing a reduced-pressure chemical vapour deposition (RPCVD). The method further includes forming a partially crystalline second layer of the first material on the at least partially crystalline first layer of the first material and on one part of the second material that is around the aperture. Finally, the method includes recrystallization annealing of the first material. The first material comprises germanium, the second material is a dielectric and the third material comprises silicon.

In still another embodiment, the present disclosure provides a semiconductor wafer having a single-crystal layer on a dielectric layer. The single-crystal layer is formed by building an at least partial crystalline first layer of the first material on the surface portion of the third material. The single-crystal layer is further formed by building a partially crystalline second layer of the first material on the at least partially crystalline first layer of the first material and on one part of a dielectric material layer around the aperture. Finally, the single-crystal layer is formed by recrystallization annealing of the first material.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
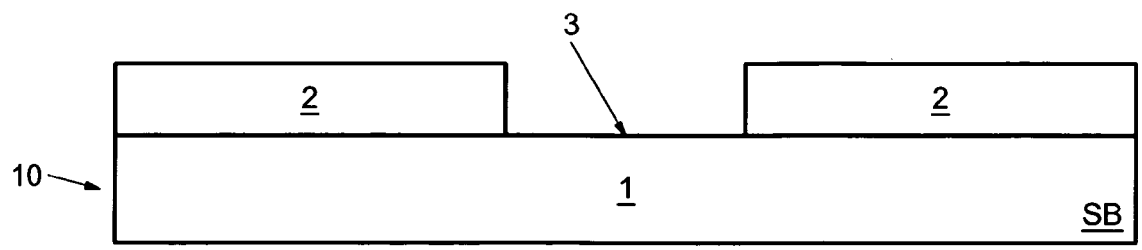
FIG. 1 is a sectional view of a wafer portion of a single-crystal material on which a dielectric layer is produced in accordance with one embodiment of the present disclosure.

FIG. 1 is a sectional view of a wafer portion 10 of a single-crystal material 1 on which a dielectric layer 2 is produced. The dielectric layer 2 has an aperture exposing a surface portion 3 of the single-crystal material 1. The wafer in FIG. 1 may be produced, for example, by depositing a uniform dielectric layer 2 on the material 1. The aperture is then produced by anisotropic etching. It will thus be possible to use an irradiated resist to define the position of the aperture and then to etch the dielectric layer 2 until a surface portion 3 of the single-crystal material 1 has been exposed. Once the aperture is obtained, the surface portion 3 of the material 1 is prepared using pre-epitaxy cleaning processes. Thus, in the case of a single-crystal silicon wafer, this cleaning may be carried out using a hydrofluoric acid (HF) bath followed by rinsing with deoxygenated deionized water and then drying with isopropyl alcohol.

Figure 2:
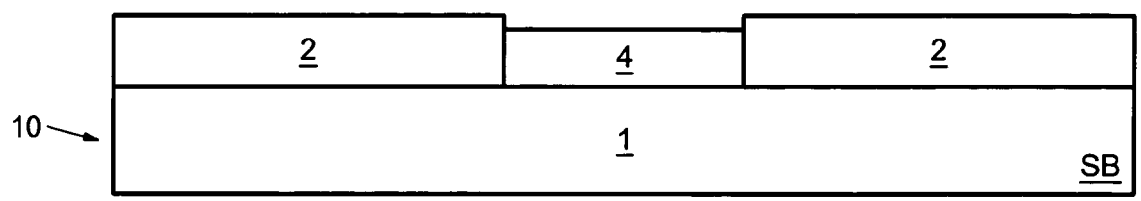
FIG. 2 illustrates the step of producing a partially crystalline layer of the first material on the surface portion of the material according to one embodiment of the present disclosure.

FIG. 2 illustrates the step of producing a partially crystalline layer 4 of the first material on the surface portion 3 of the material 1. The partially crystalline layer 4 of first material is deposited for example by reduced-pressure chemical vapour deposition (RPCVD), at low temperature, in a "thermal" epitaxy reactor. This type of deposition is known per se and the reader may refer for example to French Patent FR 2 783 254. The RPCVD deposition may be preceded by in situ cleaning of the surface, at a temperature between 700° C. and 1050° C., under a pressure of 10 to 80 torr and a flow rate of 10 to 30 slm (standard litres per minute, i.e. one litre per minute under standard pressure (1 atm) and temperature (0° C.) conditions) of $H_2$. The deposition of the first material, here germanium, takes place at a temperature between 300° C. and 450° C., under atmospheric pressure or reduced pressure (20 to 80 torr), with a $GeH_4/H_2$ flow rate of between 100 and 400 sccm (standard cubic centimetres per minute, i.e. one cubic centimetre per minute under standard pressure (1 atm) and temperature (0° C.) conditions) and with an $H_2$ flow rate of between 10 and 60 slm. The flow rates are given as an example, in which $GeH_4/H_2$ corresponds to germane ($GeH_4$) diluted to 10% in hydrogen ($H_2$). During the deposition, the germanium is naturally selective with respect to the insulator.

After deposition of the germanium, recrystallization annealing may optionally be carried out at a temperature of between 800° C. and 900° C., for 1 minute, in a hydrogen atmosphere, according to the method described in French Patent FR 2 783 254. This annealing allows the germanium layer to be recrystallized, without waiting for step c) of the process. Specifically, the annealing makes the layer monocrystalline by recrystallizing the various nuclei as a single crystal lattice, preferably so as to be continuous with the single-crystal silicon lattice. This annealing operation, which is then followed by the temperature being lowered down to 450° C., may be repeated three times.

Figure 3:
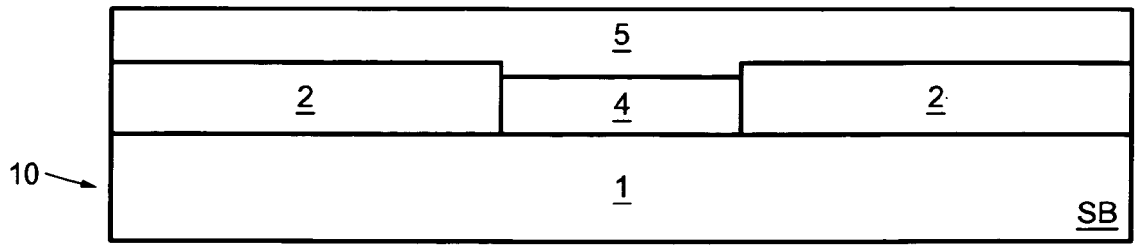
FIG. 3 illustrates the step during which an amorphous or partially crystalline second layer of the first material is deposited on the layer of first material formed beforehand and around the aperture according to one embodiment of the present disclosure.

FIG. 3 illustrates the step during which an amorphous or partially crystalline second layer 5 of the first material is deposited on the layer 4 of first material formed beforehand and around the aperture. In the example of germanium, an initial preparation step is carried out on the surface of the first layer 4 by known cleaning processes, such as the use of a hydrofluoric acid (HF) bath followed by rinsing with deoxygenated deionized water and drying with isopropyl alcohol. The second, non-selective, deposition of germanium is then carried out by PECVD or by LEPECVD or by PVD so as to cover both the aperture previously filled with germanium and the adjacent dielectric zone. The deposition typically takes place at a temperature between 300 and 500° C. using $GeH_4$. After the step, what is obtained, as illustrated in FIG. 3, is a silicon wafer 1 covered by a layer of insulator 2 and a partially crystalline germanium layer 4, the layers 2 and 4 being themselves covered by an amorphous or partially crystalline germanium layer 5.

Figure 4:
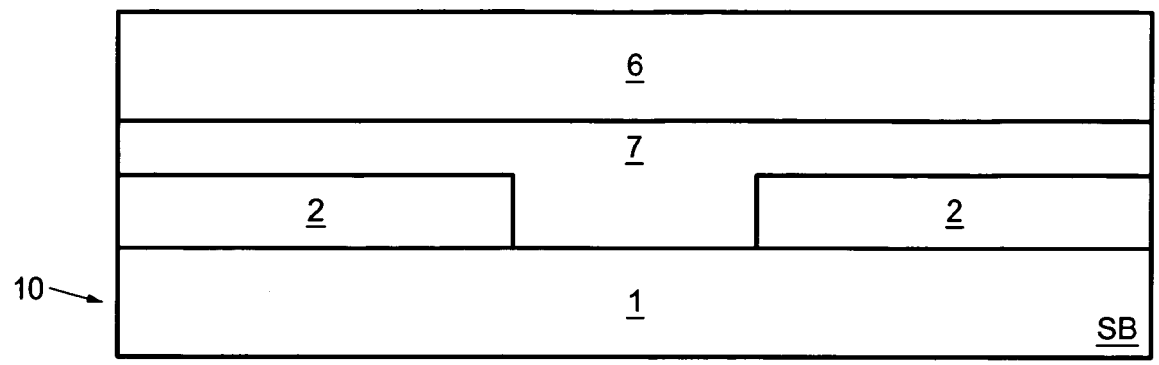
FIG. 4 illustrates the step during which the annealing gives the two germanium layers cohesion as a single crystal lattice according to one embodiment of the present disclosure.

An encapsulating layer 6 comprising silicon oxide or silicon nitride is then deposited on the layer 5. Next, the germanium layers 4, 5 undergo recrystallization and homogenization annealing. The annealing is carried out at a temperature between 800° C. and 950° C. in a controlled atmosphere, for example in hydrogen and/or nitrogen, and for a time that varies between one minute and a few tens of minutes depending on the size of the germanium-on-oxide zones and the desired final quality of the germanium. The annealing gives the two germanium layers cohesion as a single crystal lattice, preferably so as to be continuous with the single-crystal silicon lattice (cf. FIG. 4). During the annealing, the first layer 4 recrystallizes (if the recrystallization annealing following the RPCVD deposition has not been carried out) to form a single-crystal layer, and it is then the layer 5 that crystallizes as the crystal lattice of the layer 4.

Figure 5:
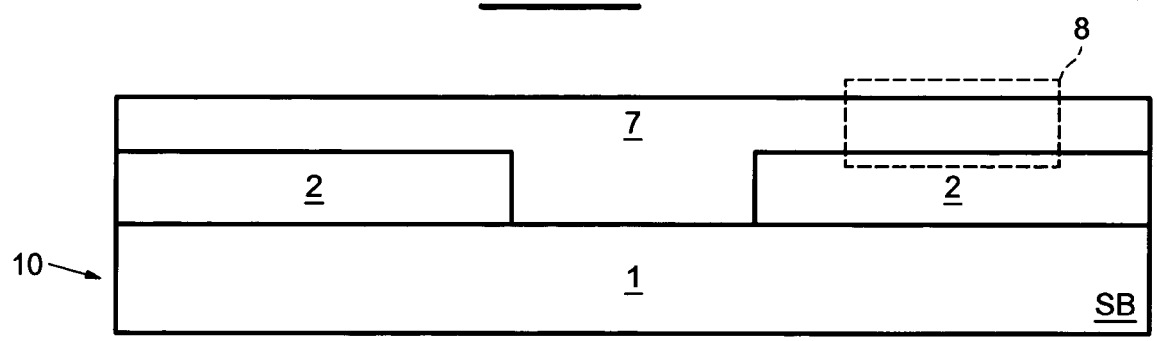
FIG. 5 illustrated the wafer obtained after an encapsulating layer is then removed according to one embodiment of the present disclosure.

The encapsulating layer 6 is then removed so as to obtain a wafer as shown in FIG. 5. An additional step can then be carried out in order to planarize the surface by chemical-mechanical polishing. The polishing is carried out in order to remove any remaining undulations on the surface of the layer 7 of first material and to reduce the thickness of the layer 7, if required. What is then obtained is a single-crystal germanium-on-insulator zone 8.

Figure 6:
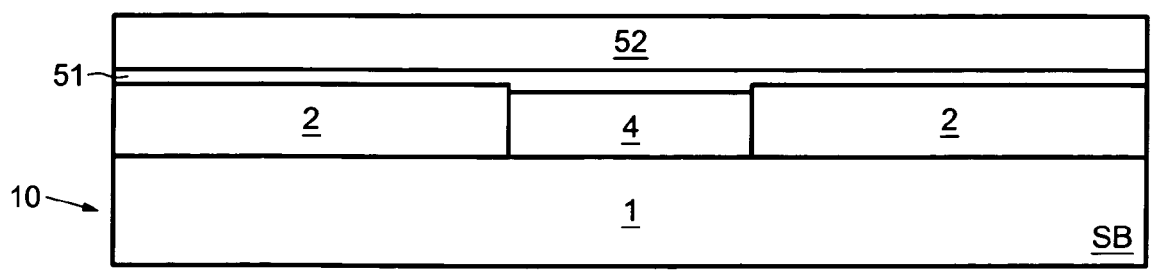
FIG. 6 illustrates the wafer obtained using a process in accordance with one embodiment of the present disclosure.

FIG. 6 illustrates a variant of the process presented above. In this variant, the second layer 51 of first material is deposited only with a thickness sufficient to cover the dielectric layer 2. Once the dielectric layer 2 has been covered, the first deposition method used (RPCVD) can then be employed in order to deposit a third layer 52 of first material so as to obtain the desired thickness of first material. This variant has an advantage when the first deposition method produces a material of better quality, especially in terms of contaminants, than the second method. The benefit of depositing the second layer of first material is that it is possible to produce a layer of first material on the dielectric layer without being impeded by the dewetting of the first material on the second.

Thus, the process proposes a method of producing a layer of a material such as germanium on a dielectric layer. In particular, the process makes it possible to produce a localized region in which there is a single-crystal germanium-on-insulator layer. The surface of the layer of insulator is substantially parallel to the surface of the subjacent third material. In addition, the subjacent third material is preferably a layer of single-crystal silicon. The process comprises the deposition of two germanium layers, one partially crystalline and the other amorphous or partially crystalline, using two different methods having different selectivities with respect to an insulator.

In other words, the invention also relates to a process for producing a layer of single-crystal germanium on an insulator and on a portion of single-crystal silicon, the process comprising a step of forming a single-crystal germanium layer on the portion of single-crystal silicon, then a step of forming an amorphous or partially crystalline germanium layer on the insulator and on the single-crystal germanium layer, and then a step of crystallizing the amorphous or partially crystalline germanium layer.

Thanks to the process, it then becomes possible to produce, within one and the same wafer, transistors on a germanium-on-insulator substrate and transistors on a silicon-on-insulator substrate, or else transistors on a germanium-on-insulator substrate and transistors on a pure silicon substrate. The process also makes it possible to limit the amount of germanium deposited, and therefore to limit the costs. It is thus possible to produce areas ranging from a few hundred square nanometres to a few square microns having a single-crystal germanium-on-insulator surface.

Preferably, the first and third materials are semiconductor materials comprising boron, germanium, silicon, arsenic, phosphorus, antimony, tellurium, polonium, astatine or mixtures thereof. Advantageously, the first material comprises germanium. The third material may comprise silicon. Finally, the second material is a dielectric and comprises, preferably, an oxide of the third material or a nitride of the third material.

Thus, the invention remedies the abovementioned drawbacks by making it possible to produce, in a localized manner, a single-crystal germanium layer on a dielectric layer. This is because the germanium-on-insulator assembly is produced around the surface portion of the third material. The choice of location of this portion and the extent of the germanium layer therefore make it possible to define the zone on which it is desired to produce the germanium-on-insulator layer.

As indicated, the third material preferably comprises silicon. In particular, the third material may be the single-crystal silicon layer of the wafer. The wafer may be freely chosen between a pure single-crystal silicon wafer and a silicon-on-insulator wafer. In the latter case, it is therefore possible to produce, for a lower cost, a wafer alloying both the advantages of silicon on insulator and the advantages of germanium on insulator. Preferably, step a) of the process comprises a reduced-pressure chemical vapour deposition (RPCVD).

Considered here in particular is the case in which the first material is germanium, the third is silicon and the second is silica. Step a) is used to produce an at least partially crystalline germanium first layer on the surface portion of the silicon. The RPCVD deposition produces firstly a partially crystalline germanium first layer. The layer thus comprises various nuclei that have crystallized in possibly different crystal lattices. In addition, the RPCVD deposition allows the germanium to be deposited selectively on the silicon. This is because germanium deposited by RPCVD dewets the surface of the silicon oxide and preferably tends to form bonds with the surface portion of the silicon or with the other germanium atoms.

Preferably, step b) comprises a plasma-enhanced chemical vapour deposition (PECVD) or a low-energy plasma-enhanced chemical vapour deposition (LEPECVD) or a physical vapour deposition (PVD).

The germanium second layer thus deposited is amorphous or partially crystalline and the deposition is less selective with respect to germanium or silicon than deposition by RPCVD.

In this way, it is possible to deposit a germanium layer on the surface of the oxide. The regions where the single-crystal germanium-on-insulator layers will be produced are determined by the regions where the germanium is deposited on the oxide during step b). Since the deposition of the germanium second layer is not selective, it is possible to deposit the germanium second layer over the entire surface of the oxide. The germanium-on-insulator regions may therefore be defined by standard lithographic processes.

Preferably, step b) comprises a step for the chemical-mechanical polishing of the surface of the second material and/or of the surface of the first layer of the first material, and then the deposition of the second layer of the first material.

It is thus possible to ensure that the deposition of the second layer of first material takes place on an almost planar surface comprising the surface of the first layer of first material and the surface of the second material. Depending on the thickness of the first layer of first material and on the depth of the cavities in the second material, it will be possible to polish one of the two materials so as to obtain a general surface that exhibits good planarity before the second layer of first material is deposited.

Preferably, before step a) a layer comprising said second material is formed on at least a part of the surface of said single-crystal third material, and then at least one aperture is produced in said layer comprising said second material, so as to form an aperture exposing a surface portion of said single-crystal third material.

It is thus particularly easy to produce, at precise locations, the single-crystal layer of first material on the second material. To do this, all that is required is to deposit, at the chosen location, a layer of second material, and then to produce, near the chosen location, an aperture exposing a surface portion of the third material.

Preferably, step c) comprises the deposition of a dielectric layer that encapsulates the second layer of the first material, an annealing operation, and then the removal of the encapsulating dielectric layer.

This step makes it possible to recrystallize together, in one and the same crystal lattice, the two layers of first material that were deposited beforehand using the two different deposition methods. What happens is that the partially crystalline first layer becomes, during annealing, monocrystalline and allows the second layer in turn to crystallize in the same crystal lattice as the first layer. Therefore one and the same single-crystal region is obtained.

It is also possible, between step b) and step c), to form a third layer of the first material on said second layer of said first material by reduced-pressure chemical vapour deposition (RPCVD).

An additional step for the chemical-mechanical polishing of the surface of the first material may be carried out. This chemical-mechanical polishing step may be carried out either after the encapsulating layer has been removed or before the encapsulating layer has been deposited.

The invention therefore makes it possible, in certain cases, to integrate, into integrated circuits produced on a single-crystal silicon layer, the technology developed around germanium while avoiding a substantial cost increase.

In particular, the invention makes it possible to produce, within one and the same wafer, either transistors on a germanium-on-insulator substrate with transistors on a silicon-on-insulator substrate, or transistors on a germanium-on-insulator substrate with transistors on a silicon substrate.

Other advantages and features of the invention will become apparent on examining the detailed description of an entirely non-limiting method of implementation, and from the appended drawings in which FIGS. 1 to 6 illustrate schematically the main steps in one method of implementing the process according to the invention.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A process for producing a single-crystal first material layer on a second material, the second material having at least one aperture exposing a surface portion of a single-crystal third material, the process comprising:
   forming an at least partial crystalline first layer of the first material on the surface portion of the third material;
   forming a partially crystalline second layer of the first material on the at least partially crystalline first layer of the first material and on one part of the second material that is around the aperture; and
   recrystallization annealing of the first material.

2. The process according to claim 1, wherein the first material comprises germanium.

3. The process according to claim 2, wherein the third material comprises silicon.

4. The process according to claim 1, wherein the second material is a dielectric.

5. The process according to claim 1, wherein the second material comprises an oxide of the third material.

6. The process according to claim 1, wherein the second material comprises a nitride of the third material.

7. The process according to claim 1, wherein the forming an at least partial crystalline first layer of the first material further comprises:
   performing a reduced-pressure chemical vapour deposition (RPCVD).

8. The process according to claim 1, wherein the forming a partially crystalline second layer of the first material further comprises:
   performing at least one of: a plasma-enhanced chemical vapour deposition (PECVD), a low-energy plasma-enhanced chemical vapor deposition (LEPECVD), and a physical vapour deposition (PVD).

9. The process according to claim 1, wherein the forming a partially crystalline second layer of the first material further comprises:
   performing a chemical-mechanical polishing of at least one of: the surface of the second material and the surface of the first layer of the first material.

10. The process according to claim 9 further comprises:
    depositing a second layer of the first material.

11. The process according to claim 1, wherein prior to the forming of an at least partial crystalline first layer of the first material, forming a layer comprising said second material is formed on a part of the surface of said single-crystal third material; and producing at least one aperture in said layer comprising the second material, said aperture exposing a surface portion of said single-crystal third material.

12. The process according to claim 1, wherein the recrystallization annealing of the first material further comprises:
    depositing a dielectric layer that encapsulates the second layer of the first material;
    performing an annealing operation; and
    removing the encapsulating dielectric layer.

13. The process according to claim 1, further comprising:
    forming a third layer of the first material on the second layer of the first material by reduced-pressure chemical vapour deposition (RPCVD).

14. The process according to claim 1, further comprising:
    chemical-mechanical polishing the surface of the first material.

15. A method of producing a single-crystal first material layer on a second material, the second material having at least one aperture exposing a surface portion of a single-crystal third material, the method comprising:
    forming an at least partial crystalline first layer of the first material on the surface portion of the third material by:
    performing a reduced-pressure chemical vapour deposition (RPCVD);
    forming a partially crystalline second layer of the first material on the at least partially crystalline first layer of the first material and on one part of the second material that is around the aperture; and
    recrystallization annealing of the first material, wherein the first material comprises germanium, the second material is a dielectric and the third material comprises silicon.

16. The method according to claim 15, wherein the recrystallization annealing of the first material further comprises:
    depositing a dielectric layer that encapsulates the second layer of the first material;
    performing an annealing operation; and
    removing the encapsulating dielectric layer.

17. The method according to claim 15, further comprising:
    forming a third layer of the first material on the second layer of the first material by reduced-pressure chemical vapour deposition (RPCVD).

* * * * *